(12) United States Patent
Suzuki

(10) Patent No.: US 8,264,303 B2
(45) Date of Patent: Sep. 11, 2012

(54) COMPOSITE SUBSTRATE AND ELASTIC WAVE DEVICE USING THE SAME

(75) Inventor: Kenji Suzuki, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 423 days.

(21) Appl. No.: 12/688,020

(22) Filed: Jan. 15, 2010

(65) Prior Publication Data

US 2010/0182101 A1    Jul. 22, 2010

(30) Foreign Application Priority Data

Jan. 19, 2009    (JP) ................... 2009-009043

(51) Int. Cl.
*H03H 9/08* (2006.01)
*H03H 9/25* (2006.01)
*H03H 9/64* (2006.01)

(52) U.S. Cl. ............... 333/193; 310/313 R; 310/313 A; 310/346; 333/155

(58) Field of Classification Search .......... 333/150–155, 333/193–196; 310/313 R, 313 A, 346
See application file for complete search history.

(56) References Cited

U.S. PATENT DOCUMENTS

| 4,511,816 A | * | 4/1985 | Mikoshiba et al. | ....... 310/313 A |
| 4,516,049 A | * | 5/1985 | Mikoshiba et al. | ....... 310/313 A |
| 4,567,393 A | * | 1/1986 | Asai et al. | ................. 310/313 A |
| 2007/0120623 A1 | | 5/2007 | Sakiyama et al. | |
| 2010/0244631 A1 | * | 9/2010 | Kobayashi et al. | ........... 310/346 |

FOREIGN PATENT DOCUMENTS

| JP | 07-066669 A1 | 3/1995 |
| JP | 10-084247 A1 | 3/1998 |
| JP | 2007-150931 A1 | 6/2007 |

* cited by examiner

*Primary Examiner* — Barbara Summons
(74) *Attorney, Agent, or Firm* — Burr & Brown

(57) ABSTRACT

A composite substrate 10 includes: a piezoelectric substrate 12 capable of transmitting an elastic wave and composed of lithium tantalate (LT); a silicon support substrate 14 that is bonded to the rear surface of the piezoelectric substrate in the (111) plane; and an adhesive layer 16 bonding the substrates 12 and 14 to each other.

7 Claims, 5 Drawing Sheets

COMPOSITE SUBSTRATE AND ELASTIC WAVE DEVICE USING THE SAME

BACKGROUND ART

1. Field of the Invention

The present invention relates to a composite substrate, and an elastic wave device using the same.

2. Description of the Related Art

As elastic wave devices, surface acoustic wave devices that can function as filters or resonators for use in, for example, cellular phones, Lamb wave devices or thin film resonators (FEAR: Film Bulk Acoustic Resonator) using a piezoelectric thin film, and the like are known. Surface acoustic wave devices have a structure in which a support substrate and a piezoelectric substrate that transmits a surface acoustic wave wave are bonded to each other and a comb shaped electrode capable of exciting a surface acoustic wave is provided on the front surface of the piezoelectric substrate. Thus, by bonding a support substrate having a coefficient of thermal expansion smaller than that of a piezoelectric substrate to the piezoelectric substrate, changes in the dimension of the piezoelectric substrate caused by the temperature changes are suppressed to thereby suppress changes in the frequency properties as surface acoustic wave devices. For example, Patent Document 1 proposes a surface acoustic wave device having a structure in which an LT substrate (LT is the abbreviation for lithium tantalate) as a piezoelectric substrate and a silicon substrate as a support substrate are bonded to each other with an adhesive layer containing an epoxy adhesive. Such a surface acoustic device is disposed on a ceramic substrate by flip chip bonding through a gold ball, and sealed with a resin. Then, an electrode provided on the rear surface of the ceramic substrate is mounted on a printed-circuit board through a lead-free solder. Such a surface acoustic wave device may be mounted on a ceramic substrate through a ball containing a lead-free solder in place of the gold ball. Also in this case, in a reflow process, the lead-free solder is melted and re-solidified for mounting.

Patent Document 1: JP 2007-150931 A

SUMMARY OF THE INVENTION

However, the prior art surface acoustic wave devices have posed a problem that fracture of devices sometimes occurs after the completion of a reflow process, resulting in a poor production yield. The reasons for causing such a problem is thought to reside in the fact that a difference in the coefficient of thermal expansion between the piezoelectric substrate and the support substrate is large, and thus the device cannot stand the temperature (about 260° C.) of the reflow process.

The present invention has been made in view of the above-described problems, and has a main object to provide a composite substrate that is to be utilized in an elastic wave device and has excellent heat resistance.

The present invention has employed the following measures so as to achieve the above-described object.

A composite substrate of the present invention comprises: a piezoelectric substrate capable of transmitting an elastic wave, and a silicon support substrate that is bonded to the rear surface of the piezoelectric substrate in the (111) plane via an organic adhesive layer and has a coefficient of thermal expansion smaller than that of the piezoelectric substrate.

According to the composite substrate of the invention, since the piezoelectric substrate is bonded, via the organic adhesive layer, to the silicon support substrate having a coefficient of thermal expansion smaller than that of the piezoelectric substrate, variation in the frequency temperature properties of the piezoelectric substrate can be effectively suppressed. Moreover, the heat resistance is higher than that of devices in which the support substrate is bonded to the piezoelectric substrate in the (100) plane or the (110) plane. For example, even when a reflow process is employed for mounting a surface acoustic wave device produced using the composite substrate on a mounting substrate, the occurrence of fracture in the surface acoustic wave device due to the temperature conditions (about 260° C.) at the time of reflow can be effectively suppressed. The reason why the heat resistance becomes high as described above is thought to reside in the fact that since the support substrate is bonded to the piezoelectric substrate in the (111) plane, the thermal stress when heated is equally divided into three directions of XYZ axis directions, and thus one component of a force becomes small. In contrast, when the support substrate is bonded to the piezoelectric substrate in the (100) plane or the (110) plane, it is thought that the thermal stress is applied only in the X axis direction or applied while being equally divided into two directions of XY axis directions, and thus one component becomes high, and the heat resistance does not become high.

BEST MODES FOR CARRYING OUT THE INVENTION

Figure 1:
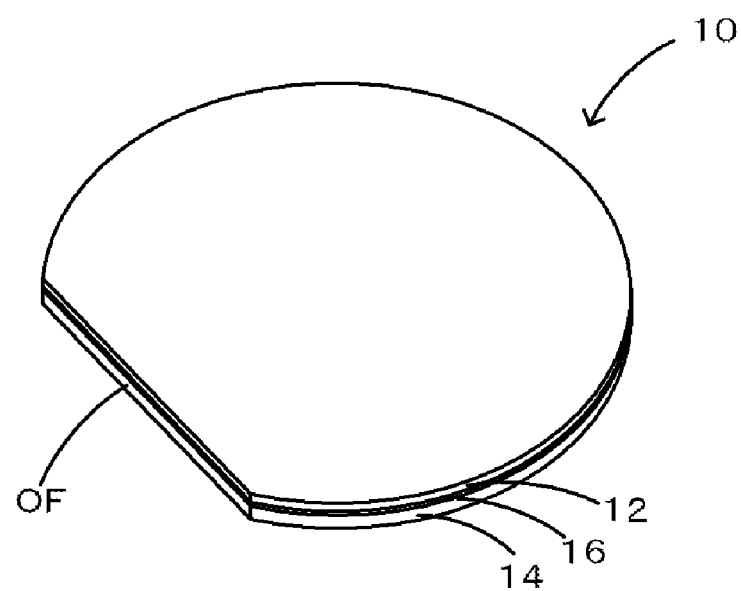
FIG. 1 is a perspective view of a composite substrate 10 of Example 1 of the present invention.

The composite substrate of the invention has a piezoelectric substrate capable of transmitting an elastic wave and a silicon support substrate that is bonded to the rear surface of the piezoelectric substrate in the (111) plane via an organic adhesive layer and has a coefficient of thermal expansion smaller than that of the piezoelectric substrate. The composite substrate is utilized for elastic wave devices.

In the composite substrate of the invention, the difference in the coefficient of thermal expansion between the piezoelectric substrate and the support substrate is preferably 10 ppm/K or more. This is because, with this range of the difference, fracture is likely to occur when heated due to a large difference in the coefficient of thermal expansion therebetween, and thus, the application of the invention is very significant.

In the composite substrate of the invention, the piezoelectric substrate is preferably composed of lithium tantalate (LT), lithium niobate (LN), a lithium niobate-lithium tantalate solid solution single crystal, crystal, or lithium borate. Among the above, the piezoelectric substrate is more preferably LT or LN. This is because the LT or LN has a high transmitting rate of a surface acoustic wave and a large electromechanical coupling coefficient, and thus the device having an LT or LN piezoelectric substrate is suitable as surface acoustic wave devices for high frequencies and wide band frequencies. The normal direction of the principal surface of the piezoelectric substrate is not particularly limited. For example, when the piezoelectric substrate contains LT, it is preferable to use one in a direction rotating from the Y axis toward the Z axis with a rotational angle 36 to 47° (e.g., 42°) about the X axis as a transmission direction of the surface acoustic wave because the transmission loss is small. When the piezoelectric substrate contains LN, it is preferable to use one in a direction rotating from the Y axis toward Z axis with a rotational angle 60 to 68° (e.g., 64°) about the X-axis as a transmission direction of the surface acoustic wave because the transmission loss is small. Furthermore, the dimension of the piezoelectric substrate is not particularly limited. For example, the diameter is 50 to 150 mm and the thickness is 0.2 to 60 μm.

In the composite substrate of the invention, the support substrate contains silicon. This is because silicon is a material that is most practically used for producing semiconductor devices, and thus a surface acoustic wave device produced and a semiconductor device using the composite substrate are easily compounded. The dimension of the support substrate is not particularly limited. For example, the diameter is 50 to 150 mm and the thickness is 100 to 500 μm. The coefficient of thermal expansion of the support substrate is preferably 2 to 7 ppm/K when the coefficient of thermal expansion of the piezoelectric substrate is 13 to 20 ppm/K.

In the composite substrate of the invention, the piezoelectric substrate and the support substrate are indirectly bonded to each other via an organic adhesive layer. As a method for indirectly bonding the substrates via an organic adhesive layer, the following method may be employed. First, the bonding surfaces of both the substrates are washed for removing impurities adhering to the bonding surfaces. Next, an organic adhesive is uniformly applied to at least one of the bonding surfaces of both the substrates. Thereafter, both the substrates are bonded to each other. Then, when the organic adhesive is a thermosetting resin, the adhesive is cured by heating. When the organic adhesive is a photocurable resins, the adhesive is cured by irradiating the adhesive with light.

The composite substrate of the invention is used for elastic wave devices. As the elastic wave devices, surface acoustic wave devices, Lamb wave devices, thin film resonators (EAR), etc., are known. For example, the surface acoustic wave devices have, on the front surface of a piezoelectric substrate, an IDT (Interdigital Transducer) electrode (hereinafter sometimes also referred to as a comb-shaped electrode or a blind-shaped electrode) of exciting the surface acoustic wave at the input side and an IDT electrode of receiving the surface acoustic wave at the output side. When a high frequency signal is applied to the IDT electrode at the input side, an electric field occurs between the electrodes, and the surface acoustic wave is excited to transmit on the piezoelectric substrate. Then, the transmitted surface acoustic wave can be taken out as an electrical signal from the IDT electrode at the output side provided in the transmission direction. When such the surface acoustic wave device is mounted on, for example, a printed-circuit board, a reflow process is employed. When a lead-free solder is used in this reflow process, the surface acoustic wave device is heated to about 260° C. However, since the surface acoustic wave device using the composite substrate of the invention is excellent in the heat resistance, the development of fracture in the piezoelectric substrate or the support substrate is suppressed.

In the composite substrate of the invention, the piezoelectric substrate may have a metal film on the rear surface. When a Lamb wave device is produced as an elastic wave device, the metal film functions for increasing the electromechanical coupling coefficient near the rear surface of the piezoelectric substrate. In this case, the Lamb wave device has a structure in which a comb-shaped electrode is formed on the front surface of the piezoelectric substrate, and the metal film of the piezoelectric substrate is exposed by a cavity formed in the support substrate. Examples of the material of such a metal film include aluminum, an aluminum alloy, copper, and gold. When the Lamb wave device is produced, a composite substrate having a piezoelectric substrate having no metal film on the rear surface may be used.

In the composite substrate of the invention, the piezoelectric substrate may have a metal film and an insulating film on the rear surface. When a thin film resonator is produced as an elastic wave device, the metal film functions as an electrode. In this case, the thin film resonator has a structure in which electrodes are formed on the front and rear surfaces of the piezoelectric substrate, and the metal film of the piezoelectric substrate is exposed by forming the insulating film into a cavity. Examples of the material of the metal film include molybdenum, ruthenium, tungsten, chromium, and aluminum. Examples of the material of the insulating film include silicon dioxide, phosphorus silica glass, and boron phosphorus silica glass.

The coefficient of thermal expansion of typical materials for use in the piezoelectric substrate and support substrate of the composite substrate of the invention is shown in Table 1.

TABLE 1

|  | Material | Coefficient of Thermal Expansion (ppm/K) |
| --- | --- | --- |
| Piezoelectric substrate | Lithium tantalate (LT) | 16.1 |
|  | Lithium niobate (LN) | 15.4 |
|  | Rock crystal | 13.7 |
|  | Lithium borate | 13 |
| Support substrate | Silicon | 3 |

EXAMPLES

Example 1

FIG. 1 is a perspective view of a composite substrate 10 of one example of the present invention. The composite substrate 10 is utilized for surface acoustic wave devices, and is formed in a round shape having one potion formed in a flat shape. The flat portion is referred to as an orientation flat (OF), and is used for, for example, detecting the position or direction of a wafer when various operations are performed in a process for producing surface acoustic wave devices. The composite substrate 10 has a piezoelectric substrate 12 containing lithium tantalate (LT) capable of transmitting a surface acoustic wave, a silicon support substrate 14 bonded to the piezoelectric substrate 12 in the (111) plane, and an adhesive layer 16 for bonding both the substrates 12 and 14. The piezoelectric substrate 12 has a diameter of 100 mm, a thickness of 30 μm, and a coefficient of thermal expansion of 16.1 ppm/K. The piezoelectric substrate 12 is a 42° Y cut X transmission LT substrate that is rotated with a rotational angle 42° from the Y axis toward the Z axis about the X axis as a transmission direction of the surface acoustic wave. The support substrate 14 has a diameter of 100 mm, a thickness of 350 µm, and a coefficient of thermal expansion of 3 ppm/K. Therefore, the difference in the coefficient of thermal expansion therebetween is 13.1 ppm/K. The adhesive layer 16 is obtained by solidification of a thermosetting epoxy resin adhesive, and has a thickness of 0.3 µm.

Figure 2A:
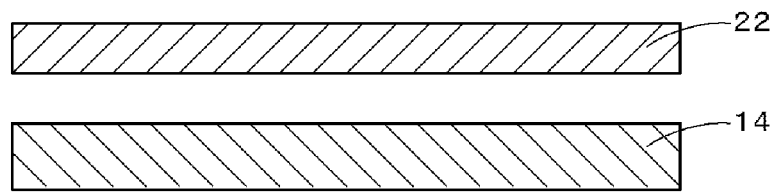
FIG. 2 schematically illustrates explanatory views of a method for producing the composite substrate 10.
Figure 2B:
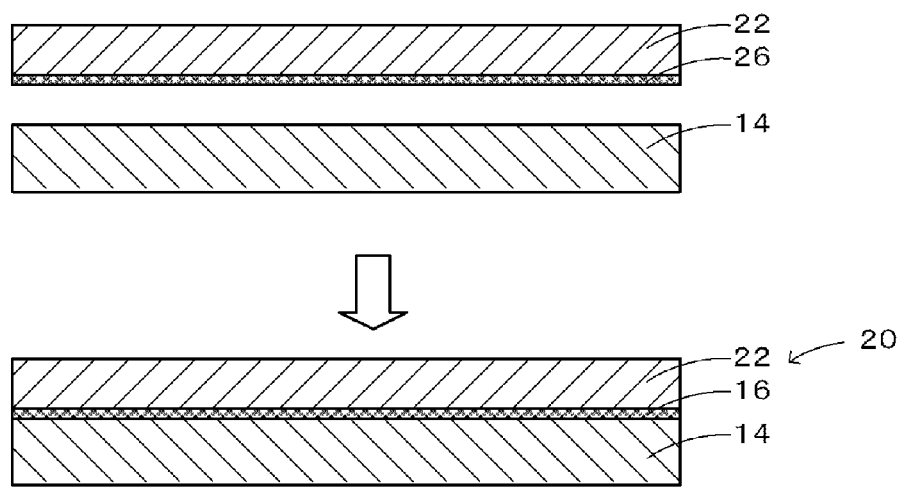
Figure 2C:
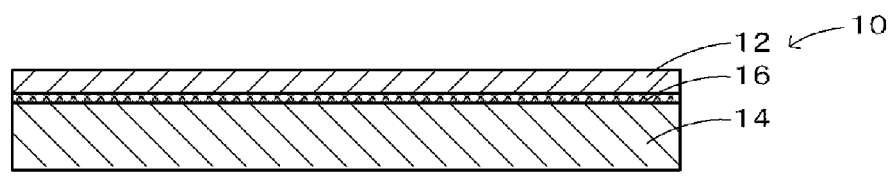

A method for producing the composite substrate 10 will be described below with reference to FIGS. 2A to 2C. FIG. 2A to 2C are explanatory views (cross sections) for schematically illustrating a method for producing the composite substrate 10. First, a silicon substrate having an OF, a diameter of 100 mm, a thickness of 350 µm, and a plane direction of (111) was prepared as the support substrate 14. As a piezoelectric substrate 22 before polishing, a 42° Y cut X transmission LT substrate having an OF, a diameter of 100 mm, and a thickness of 250 µm was prepared (FIG. 2A). Subsequently, a thermosetting epoxy resin adhesive 26 was applied to the rear surface of the piezoelectric substrate 22 by spin coating. The piezoelectric substrate 22 was bonded to the front surface of the support substrate 14, and then heated at 180° C. to cure the epoxy resin adhesive 26, thereby obtaining a bonded substrate (composite substrate before polishing) 20. The adhesive layer 16 of the bonded substrate 20 is obtained by solidification of the epoxy resin adhesive 26 (FIG. 2B). The thickness of the adhesive 16 at this time was 0.3 µm.

Subsequently, the piezoelectric substrate 22 was lapped and polished until the thickness reached 30 µm by a lapping and polishing machine (FIG. 2C). The process was performed using machine that first performs lapping to reduce the thickness of the piezoelectric substrate 22 and subsequently performs mirror polishing. The specific procedure of lapping to reduce the thickness inserted the bonded substrate between a surface plate and a pressure plate, supplied a slurry containing abrasive particles between the bonded substrate 20 and the surface plate, and then applied rotation motion to the pressure plate While pressing the bonded substrate 20 against the surface plate by the pressure plate. The conditions of the lapping was such that the rotational speed of the rotation motion was 100 rpm and the duration time was 60 minutes, while the front surface of the piezoelectric substrate 22 of the bonded substrate 20 was pressed against the surface of the surface plate. The specific procedure of mirror polishing prepared a surface plate, to the front surface of which a pad was adhered, and abrasive particles with a high count, and then applied rotation motion and revolution motion to the pressure plate, thereby mirror polishing the front surface of the piezoelectric substrate 22. The conditions of mirror polishing was such that the pressure for pressing the bonded substrate 20 against the surface of the surface plate was 0.2 MP, the rotational speed of the rotation motion was 100 rpm, the rotational speed of the revolution motion was 100 rpm, and the polishing duration time was 60 minutes. The piezoelectric substrate 22 before lapping and polishing becomes a piezoelectric substrate 12 through lapping polishing, and thus the composite substrate 10 was completed.

Figure 3:
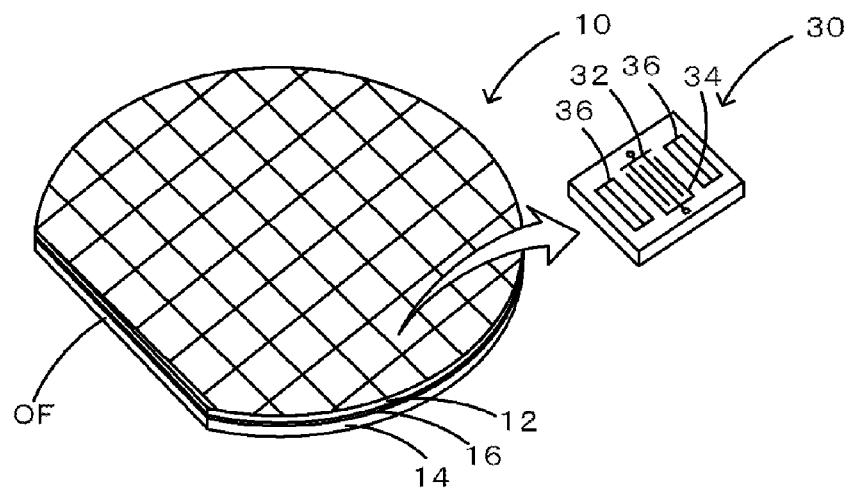
FIG. 3 is a perspective view of a surface acoustic wave device 30 produced using the composite substrate 10.
Figure 4:
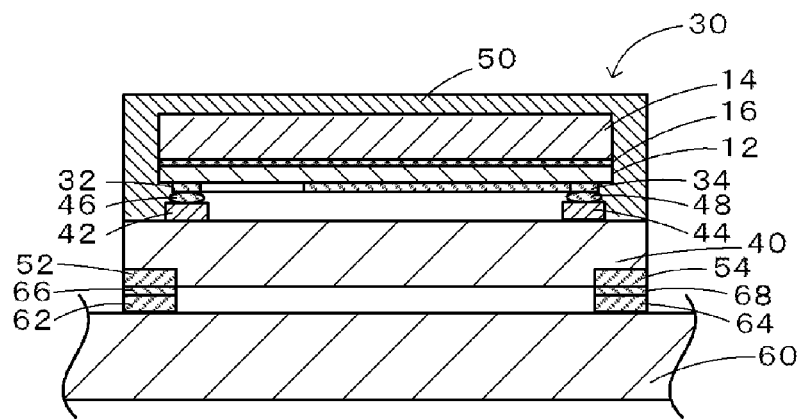
FIG. 4 is a sectional view of the surface acoustic wave device 30 mounted on a ceramic substrate 40 and further mounted on a printed circuit board 60.

Then, the composite substrate 10 was formed into an assembly of a plurality of surface acoustic wave devices using a general photolithography technique, and then cut into one surface acoustic wave device 30 by dicing. FIG. 3 illustrates this process. The surface acoustic wave device 30 has IDT electrodes 32 and 34 and reflective electrodes 36 formed on the front surface of the piezoelectric substrate 12 by a photolithography technique. The obtained surface acoustic wave device 30 is mounted on a printed circuit board 60 as follows. As illustrated in FIG. 4, the IDT electrodes 32 and 34 and pads 42 and 44 of a ceramic substrate 40 are connected to each other through gold balls 46 and 48, respectively, and then sealed by a resin 50 on the ceramic substrate 40. A lead-free soldering paste was Interposed between electrodes 52 and 54 provided on the rear surface of the ceramic substrate 40 and pads 62 and 64 of the printed circuit board 60, and then the surface acoustic wave device 30 was mounted on the printed-circuit board 60 by a reflow process. FIG. 4 illustrates solders 66 and 68 after the soldering pastes were melted and re-solidified.

Figure 5A:
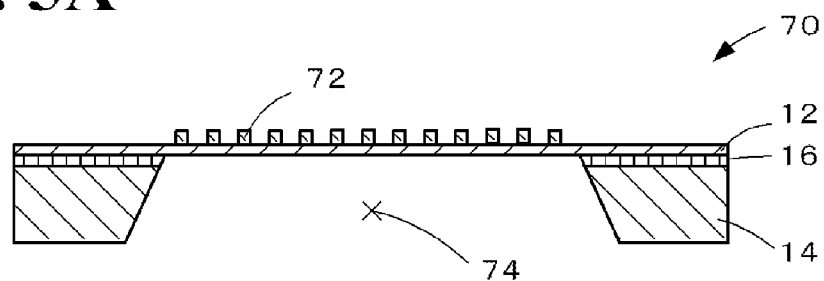
FIG. 5 is a sectional view of a Lam wave device 70.
Figure 5B:
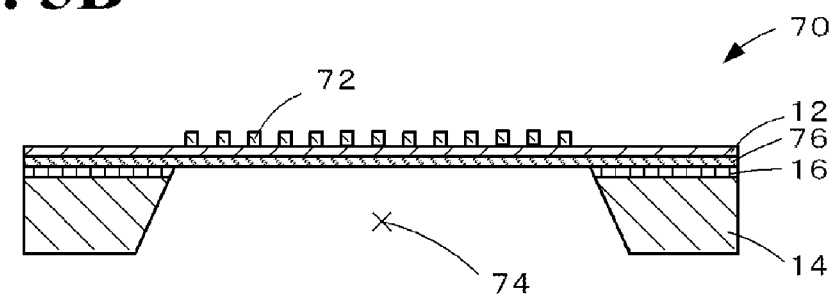
Figure 6:
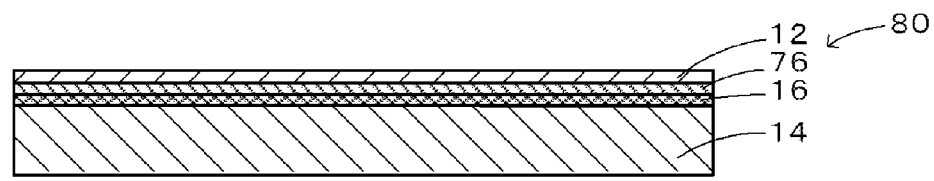
FIG. 6 is a sectional view of a composite substrate 80 as a Lam wave device.

A Lamb wave device 70 illustrated in FIG. 5A may be produced, in place of the surface acoustic wave device 30, from the composite substrate 10. The Lamb wave device 70 has a structure in which an IDT electrode 72 is provided on the front surface of the piezoelectric substrate 12, and a cavity 74 is formed in the support substrate 14 to expose the rear surface of the piezoelectric substrate 12. The Lamb wave device 70 thus obtained may have an aluminum metal film 76 on the rear surface of the piezoelectric substrate 12 as illustrated in FIG. 5B. In this case, as illustrated in FIG. 6, a composite substrate 80 having the metal film 76 on the rear surface of the piezoelectric substrate 12 is used. The composite substrate 80 can be produced using the piezoelectric substrate 12 having the metal film 76 on the rear surface in place of the piezoelectric substrate 12 in the method for producing the composite substrate 10 (FIG. 2).

Figure 7:
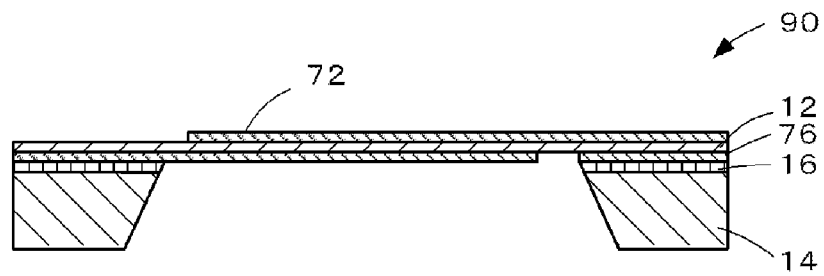
FIG. 7 is a sectional view of a thin film resonator 90.

As illustrated in FIG. 7, the composite substrate 80 illustrated in FIG. 6 can also be applied to a thin film resonator 90 having the same structure as that illustrated in FIG. 5A, in which only electrodes are formed on the front and rear surfaces of the piezoelectric substrate 12.

Figure 8:
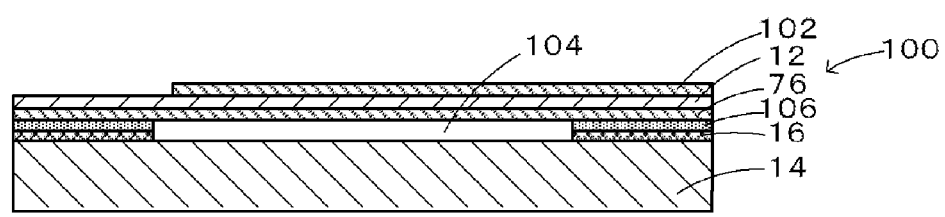
FIG. 8 is a sectional view of a thin film resonator 100.
Figure 9:
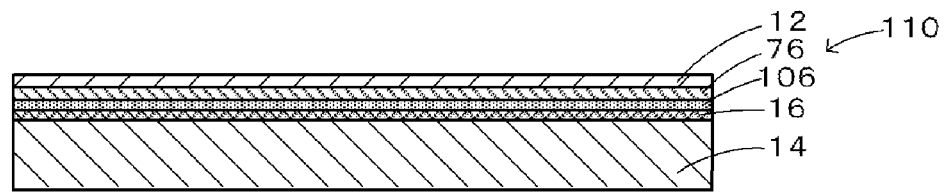
FIG. 9 is a sectional view of a composite substrate 110 as the thin film resonator 100.

Furthermore, a thin film resonator (FEAR) 100 illustrated in FIG. 8 may be produced. The thin film resonator 100 has a structure in which an electrode 102 is provided on the front surface of the piezoelectric substrate 12 and a cavity 104 is formed between the support substrate 14 and the metal film 76 functioning as a rear electrode of the piezoelectric substrate 12. The cavity 104 is obtained by etching an insulating film 106 and the adhesive layer 16 with an acid liquid (e.g., fluoronitric acid and hydrofluoric acid). Examples of the material of the insulating film 106 include phosphorus silica glass, and boron phosphorus silica glass, for example. Here, silicon dioxide is used. The thickness of the insulating film 106 is not particularly limited, and is 0.1 to 2 µm. The thin film resonator 100 can be produced using a composite substrate 110 having the metal film 76 and the insulating film 106 on the rear surface of the piezoelectric substrate 12 as illustrated in FIG. 9.

Comparative Example 1

A composite substrate 10 was produced in the same manner as in Example 1, except that a silicon substrate having a plane direction of (100) was used as the support substrate 14.

Comparative Example 2

A composite substrate 10 was produced in the same manner as in Example 1, except that a silicon substrate having a plane direction of (110) was used as the support substrate 14.

Heat Resistance Evaluation 1

Evaluation of heat resistance was conducted by observing the state of the composite substrates 10 of Example 1 and Comparative Examples 1 and 2 when the composite substrates were put in a heating furnace, and the temperature was increased to 280° C. In the composite substrate 10 of Example 1, fracture did not occur in the piezoelectric substrate 12 nor the support substrate 14 until the temperature reached 280° C.

In contrast, in the composite substrate 10 of Comparative Example 1, fracture occurred almost in parallel to the OF in the piezoelectric substrate 12 from when the temperature reached 200° C., and fracture occurred throughout the piezoelectric substrate 12 at 280° C. In the composite substrate 10 of Comparative Example 2, fracture occurred almost in parallel to the OF in the piezoelectric substrate 12 from when the temperature reached 250° C., and fracture occurred throughout the piezoelectric substrate 12 at 280° C. The above results revealed that the composite substrate 10 of Example 1 has much higher heat resistance than that of Comparative Examples 1 and 2.

Example 2

A hundred composite substrates 10 were produced in the same manner as in Example 1, except that the thickness of the support substrate 14 was 250 µm and the adhesive layer 16 was obtained by solidification of acrylic resin in place of epoxy resin and had thickness of 0.6 µm.

Comparative Example 3

Fifty composite substrates 10 were produced in the same manner as in Example 2, except that a silicon substrate having a plane direction of (100) was used as the support substrate 14.

Comparative Example 4

Fifty composite substrates 10 were produced in the same manner as in Example 2, except that a silicon substrate having a plane direction of (110) was used as the support substrate 14.

Heat Resistance Evaluation 2

In the composite substrates 10 of Example 2 and Comparative Examples 3 and 4, fracture did not occur in all the produced components. These composite substrates 10 were put in a heating furnace, the temperature was increased to 280° C., and then heat treatment was performed at 280° C. for 1 hour. In the composite substrate 10 of Example 2, fracture or cracks did not occur in the piezoelectric substrate 12 nor the support substrate 14. In contrast, in all the 50 composite substrate 10 of Comparative Example 3, fracture or cracks occurred in the piezoelectric substrate 12. In 35 composite substrates 10 out of the 50 composite substrate 10 of Comparative Example 4, fracture or cracks occurred in the piezoelectric substrate 12. The above results revealed that that the composite substrate 10 of Example 2 has much higher heat resistance than that of Comparative Examples 3 and 4.

Example 3

A hundred composite substrates 10 were produced in the same manner as in Example 1, except that the thickness of the support substrate 14 is 200 µm, the thickness of the piezoelectric substrate 12 is 20 µm, and the adhesive layer 16 was obtained by solidification of acrylic resin in place of epoxy resin and had thickness of 0.6 µm.

Comparative Example 5

Fifty composite substrates 10 were produced in the same manner as in Example 3, except that a silicon substrate having a plane direction of (100) was used as the support substrate 14.

Comparative Example 6

Fifty composite substrates 10 were produced in the same manner as in Example 3, except that a silicon substrate having a plane direction of (110) was used as the support substrate 14.

Heat Resistance Evaluation 3

In the composite substrates 10 of Example 3 and Comparative Examples 5 and 6, fracture did not occur in all the produced components. These composite substrates 10 were put in a heating furnace, the temperature was increased to 280° C., and then heat treatment was performed at 280° C. for 1 hour. In the composite substrate 10 of Example 3, fracture or cracks did not occur in the piezoelectric substrate 12 nor the support substrate 14. In contrast, in all the 50 composite substrate 10 of Comparative Example 5, fracture or cracks occurred in the piezoelectric substrate 12. In 40 composite substrates 10 out of the 50 composite substrate 10 of Comparative Example 6, fracture or cracks occurred in the piezoelectric substrate 12. The above results revealed that that the composite substrate 10 of Example 3 has much higher heat resistance than that of Comparative Examples 5 and 6.

Example 4

A hundred composite substrates 10 were produced in the same manner as in Example 1, except that the piezoelectric substrate 12 is a 36° Y cut X transmission LT substrate that is rotated with a rotational angle 36° from the Y axis toward the Z axis about the X axis as a transmission direction of the surface acoustic wave and the adhesive layer 16 was obtained by solidification of acrylic resin in place of epoxy resin and had thickness of 0.6 µm.

Comparative Example 7

Fifty composite substrates 10 were produced in the same manner as in Example 4, except that a silicon substrate having a plane direction of (100) was used as the support substrate 14.

Comparative Example 8

Fifty composite substrates 10 were produced in the same manner as in Example 4, except that a silicon substrate having a plane direction of (110) was used as the support substrate 14.

Heat Resistance Evaluation 4

In the composite substrates 10 of Example 4 and Comparative Examples 7 and 8, fracture did not occur in all the produced components. These composite substrates 10 were put in a heating furnace, the temperature was increased to 280° C., and then heat treatment was performed at 280° C. for 1 hour. In the composite substrate 10 of Example 4, fracture or cracks did not occur in the piezoelectric substrate 12 nor the support substrate 14. In contrast, in all the 50 composite substrate 10 of Comparative Example 7, fracture or cracks occurred in the piezoelectric substrate 12. In 32 composite substrates 10 out of the 50 composite substrate 10 of Comparative Example 8, fracture or cracks occurred in the piezoelectric substrate 12. The above results revealed that that the composite substrate 10 of Example 4 has much higher heat resistance than that of Comparative Examples 7 and 8.

Example 5

A hundred composite substrates 10 were produced in the same manner as in Example 1, except that the piezoelectric substrate 12 is a 47° Y cut X transmission LT substrate that is rotated with a rotational angle 47° from the Y axis toward the Z axis about the X axis as a transmission direction of the surface acoustic wave and the adhesive layer 16 was obtained by solidification of acrylic resin in place of epoxy resin and had thickness of 0.6 µm.

Comparative Example 9

Fifty composite substrates 10 were produced in the same manner as in Example 5, except that a silicon substrate having a plane direction of (100) was used as the support substrate 14.

Comparative Example 10

Fifty composite substrates 10 were produced in the same manner as in Example 5, except that a silicon substrate having a plane direction of (110) was used as the support substrate 14.

Heat Resistance Evaluation 5

In the composite substrates 10 of Example 5 and Comparative Examples 9 and 10, fracture did not occur in all the produced components. These composite substrates 10 were put in a heating furnace, the temperature was increased to 280° C., and then heat treatment was performed at 280° C. for 1 hour. In the composite substrate 10 of Example 5, fracture or cracks did not occur in the piezoelectric substrate 12 nor the support substrate 14. In contrast, in all the 50 composite substrate 10 of Comparative Example 9, fracture or cracks occurred in the piezoelectric substrate 12. In 38 composite substrates 10 out of the 50 composite substrate 10 of Comparative Example 10, fracture or cracks occurred in the piezoelectric substrate 12. The above results revealed that that the composite substrate 10 of Example 5 has much higher heat resistance than that of Comparative Examples 9 and 10.

Example 6

A hundred composite substrates 10, were produced in the same manner as in Example 1, except that the piezoelectric substrate 12 is a 64° Y cut X transmission LN (lithium niobate) substrate that is rotated with a rotational angle 64° from the Y axis toward the Z axis about the X axis as a transmission direction of the surface acoustic wave and the adhesive layer 16 was obtained by solidification of acrylic resin in place of epoxy resin and had thickness of 0.6 μm.

Comparative Example 11

Fifty composite substrates 10 were produced in the same manner as in Example 6, except that a silicon substrate having a plane direction of (100) was used as the support substrate 14.

Comparative Example 12

Fifty composite substrates 10 were produced in the same manner as in Example 6, except that a silicon substrate having a plane direction of (110) was used as the support substrate 14.

Heat Resistance Evaluation 6

In the composite substrates 10 of Example 6 and Comparative Examples 11 and 12, fracture did not occur in all the produced components. These composite substrates 10 were put in a heating furnace, the temperature was increased to 280° C., and then heat treatment was performed at 280° C. for 1 hour. In the composite substrate 10 of Example 6, fracture or cracks did not occur in the piezoelectric substrate 12 nor the support substrate 14. In contrast, in all the 50 composite substrate 10 of Comparative Example 11, fracture or cracks occurred in the piezoelectric substrate 12. In 40 composite substrates 10 out of the 50 composite substrate 10 of Comparative Example 12, fracture or cracks occurred in the piezoelectric substrate 12. The above results revealed that that the composite substrate 10 of Example 6 has much higher heat resistance than that of Comparative Examples 11 and 12.

Example 7

Fifty composite substrates 10 were produced in the same manner as in Example 6.

Comparative Example 13

Fifty composite substrates 10 were produced in the same manner as in Example 7, except that a silicon substrate having a plane direction of (111) and a 0.5 μm-$SiO_2$ layer provided thereon by heat treatment was used, and that a piezoelectric substrate was directly bonded to the silicon substrate by irradiating the bonding surface of the piezoelectric substrate and the $SiO_2$ layer on the silicon substrate with Ar inert gas in a vacuum.

Heat Resistance Evaluation 7

In the composite substrates 10 of Example 7 and Comparative Example 13, fracture did not occur in all the produced components. These composite substrates 10 were put in a heating furnace, the temperature was increased to 300° C., and then heat treatment was performed at 300° C. for 1 hour. In the composite substrate 10 of Example 7, fracture or cracks did not occur in the piezoelectric substrate 12 nor the support substrate 14. In contrast, in all the 50 composite substrate 10 of Comparative Example 13, fracture or cracks occurred in the piezoelectric substrate 12. The above results revealed that the composite substrate 10 of Example 7 has much higher heat resistance than that of Comparative Example 13.

The present invention claims priority from the Japanese Patent Application No. 2009-009043 filed on Jan. 19, 2009, the entire contents of which are incorporated herein by reference.

What is claimed is:

1. A composite substrate comprising:
a piezoelectric substrate capable of transmitting an elastic wave: and
a silicon support substrate that is bonded to the rear surface of the piezoelectric substrate in the (111) plane via an organic adhesive layer and has a coefficient of thermal expansion smaller than that of the piezoelectric substrate.

2. The composite substrate according to claim 1, wherein the piezoelectric substrate has a metal film on the rear surface.

3. The composite substrate according to claim 1, wherein the piezoelectric substrate has a metal film and an insulating film on the rear surface.

4. The composite substrate according to claim 1, wherein a difference in coefficient of thermal expansion between the piezoelectric substrate and the support substrate is 10 ppm/K or more.

5. The composite substrate according to claim 1, wherein the piezoelectric substrate is composed of lithium tantalate, lithium niobate, a lithium niobate-lithium tantalate solid solution single crystal, crystal, or lithium borate.

6. A surface acoustic wave filter produced using the composite substrate according to claim 1.

7. A surface acoustic wave resonator produced using the composite substrate according to claim 1.

* * * * *